(12) United States Patent
Kim

(10) Patent No.: US 7,518,945 B2
(45) Date of Patent: Apr. 14, 2009

(54) PAGE BUFFER CIRCUIT OF FLASH MEMORY DEVICE

(75) Inventor: Duck Ju Kim, Kyeonggi-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/292,424

(22) Filed: Dec. 2, 2005

(65) Prior Publication Data

US 2006/0221695 A1    Oct. 5, 2006

(30) Foreign Application Priority Data

Mar. 30, 2005    (KR) .................. 10-2005-0026552

(51) Int. Cl.
*G11C 8/00* (2006.01)
(52) U.S. Cl. ................ 365/230.08; 365/185.12
(58) Field of Classification Search ............ 365/230.08
See application file for complete search history.

(56) References Cited

U.S. PATENT DOCUMENTS 5,805,498 A * 9/1998 Lee et al. ............... 365/185.17
6,147,893 A * 11/2000 Liu ........................... 365/104
6,335,881 B2 * 1/2002 Kim et al. .............. 365/185.18
7,061,813 B2 * 6/2006 Lee ........................ 365/189.05
2001/0050377 A1 * 12/2001 Ikehashi et al. ............. 257/200
2003/0021172 A1 * 1/2003 Cho et al. ................... 365/203

FOREIGN PATENT DOCUMENTS

| JP | 2002-197879 A | 7/2002 |
| KR | 100259972 B1 | 3/2000 |
| KR | 10-2001-0039060 A | 5/2001 |
| KR | 10-2003-0051043 A | 6/2003 |
| KR | 2003-0072434 | 9/2003 |

* cited by examiner

*Primary Examiner*—Huan Hoang
*Assistant Examiner*—Jason Lappas
(74) *Attorney, Agent, or Firm*—Townsend and Townsend and Crew LLP

(57) ABSTRACT

A page buffer circuit of a flash memory device includes a plurality of page buffers connected to a predetermined number of bit lines, respectively, and also connected to a Y-gate circuit, the page buffers perform a read operation or a program operation at the same time in response to bit line control signals, bit line select signals and control signals. Each of page buffers included in a page buffer circuit selectively gains access to one of memory cells connected to a predetermined number of bit lines, respectively. As a result, coupling capacitance component between sensing nodes can be reduced and the overall chip size can be reduced.

8 Claims, 4 Drawing Sheets

PAGE BUFFER CIRCUIT OF FLASH MEMORY DEVICE

BACKGROUND OF THE INVENTION

The present invention relates to a flash memory device, and more specifically, to a page buffer circuit of a flash memory device.

In general, a flash memory device includes a page buffer circuit for programming or reading a large quantity of data within a short period of time. The program operation or the read operation of the flash memory device is executed on a page basis by the page buffer circuit.

FIG. 1 is a circuit diagram showing a page buffer circuit and a Y-gate circuit of a conventional flash memory device.

A page buffer circuit 11 includes a plurality of page buffers. A Y-gate circuit 12 includes a plurality of Y-gates. Page buffers 20, 30 of the page buffer circuit 11 and Y-gates G1, G2 of the Y-gate circuit 12 are shown in FIG. 1 for simplicity. The page buffers 20, 30 are connected to a pair of bit lines, respectively. To be more specific, the page buffer 20 is connected between bit lines BLe1, BLo1 and the Y-gates G1. The page buffer 30 is connected between bit lines BLe2, BLo2 and the Y-gates G2. The Y-gates G1, G2 are further connected to a data I/O line DIOL.

The page buffer 20 includes a bit line select circuit 21 and a register circuit 22. The bit line select circuit 21 includes NMOS transistors N21 to N24. The register circuit 22 includes a precharge circuit P21, a sensing circuit 23, a latch circuit 24, switches N25, N26, and a reset circuit N27. The sensing circuit 23 includes NMOS transistors N28, N29. The page buffer 30 includes a bit line select circuit 31 and a register circuit 32. The bit line select circuit 31 includes NMOS transistors N31 to N34. The register circuit 32 includes a precharge circuit P31, a sensing circuit 33, a latch circuit 34, switches N35, N36, and a reset circuit N37. The sensing circuit 33 includes NMOS transistors N38, N39.

In the read operation or the program operation, the bit line select circuit 21 connects one of the bit lines BLe1, BLo1 to a sensing node SO1. Furthermore, the register circuit 22 senses read data from one of the bit lines BLe1, BLo1 connected to the sensing node SO1 and stores the sensing data therein. In addition, the register circuit 22 stores program data therein, which will be programmed into a memory cell connected to one of the bit lines BLe1, BLo1. As a result, the read data are transferred to the register circuit 22 through the sensing node SO1 and the program data are transferred to one of the bit lines BLe1, BLo1 through the sensing node SO1.

During the read operation or the program operation, the bit line select circuit 31 and the register circuit 32 have the same operation as the bit line select circuit 21 and the register circuit 22. Read data from one of the bit lines BLe2, BLo2 are transferred to the register circuit 32 through the sensing node SO2. Program data, which will be programmed into a memory cell, is connected to one of the bit lines BLe2, BLo2 through the sensing node SO2. As a result, at the time of the read operation or the program operation, the sensing nodes SO1, SO2 have voltage levels, each corresponding to read data or program data. At this time, the voltages of the sensing nodes SO1, SO2 may be changed due to coupling capacitance component (Cc) between the sensing nodes SO1, SO2.

As a result, a problem arises because erroneous read data or program data may be generated. This problem can be more profound when a flash memory device is highly integrated and the number of bit lines increases. As the distance between the sensing nodes becomes more narrow, the voltage of the sensing node has greater influence on the voltage of a neighboring sensing node. In addition, the page buffer circuit 11 includes page buffers, each connected to a pair of bit lines. As a result, a problem arises because the overall chip size increases since the number of page buffers increases when the number of bit lines increases.

BRIEF SUMMARY OF THE INVENTION

The present invention provides a page buffer of a flash memory device, in which coupling capacitance component can be reduced between sensing nodes and the overall chip size can be reduced by including page buffers that selectively gain access to one of memory cells connected to a predetermined number of bit lines, respectively.

The present invention also provides a control method of the read operation of page buffers, in which coupling capacitance component can be reduced between sensing nodes and the overall chip size can be reduced by including page buffers that selectively gain access to one of memory cells connected to a predetermined number of bit lines, respectively.

The present invention further provides a control method of the program operation of page buffers, in which coupling capacitance component can be reduced between sensing nodes and the overall chip size can be reduced by including page buffers that selectively gain access to one of memory cells connected to a predetermined number of bit lines, respectively.

A page buffer circuit of a flash memory device according to one embodiment of the present invention includes a plurality of page buffers coupled to a predetermined number of bit lines, respectively, and also coupled to a Y-gate circuit, the page buffers configured to perform a read operation or a program operation at the same time in response to bit line control signals, bit line select signals and control signals. Each of the plurality of page buffers is configured to store sensing data corresponding to read data, which are received from one of the predetermined number of bit lines, and output the stored sensing data to the Y-gate circuit, at the time of the read operation. Each buffer is also configured to store program data, which are received from the Y-gate circuit, and output the stored program data to one of the predetermined number of bit lines, at the time of the program operation.

A control method for a read operation of a page buffer circuit according to one embodiment of the present invention includes the steps of selecting one of the predetermined number of bit lines by a bit line select circuit of each of a plurality of page buffers; connecting the selected bit line to a sensing node; separating the remaining bit lines other than the selected bit line from the sensing node by the bit line select circuit; applying a bit line bias voltage to the remaining bit lines, sensing a voltage of the sensing node corresponding to read data from the selected bit line by a sensing circuit of each of the plurality of page buffers; generating sensing data; latching the sensing data by a latch circuit of each of the plurality of page buffers; outputting inversed data by the latch circuit; and outputting the inversed data to one of the Y-gates by a switch of each page buffer in response to an I/O control signal.

A control method for a program operation of a page buffer circuit according to another embodiment of the present invention includes the steps of receiving and outputting program data from one of the Y-gates coupled to a predetermined number of bit lines further coupled to a first switch of each of a group of page buffers in response to an I/O control signal, latching the program data received from the first switch by a latch circuit of each page buffer; selecting one of the predetermined number of bit lines by a bit line select circuit of each page buffer and coupling the selected bit line to a sensing node; separating the remaining bit lines other than the selected bit line from the sensing node by the bit line select circuit and applying a bit line bias voltage to the remaining bit lines; and outputting the program data latched in the latch circuit by a second switch of each page buffer to the selected bit line through the sensing node in response to a program control signal.

DETAILED DESCRIPTION OF THE INVENTION

The present invention will now be described in connection with specific embodiments with reference to the accompanying drawings.

Figure 1:
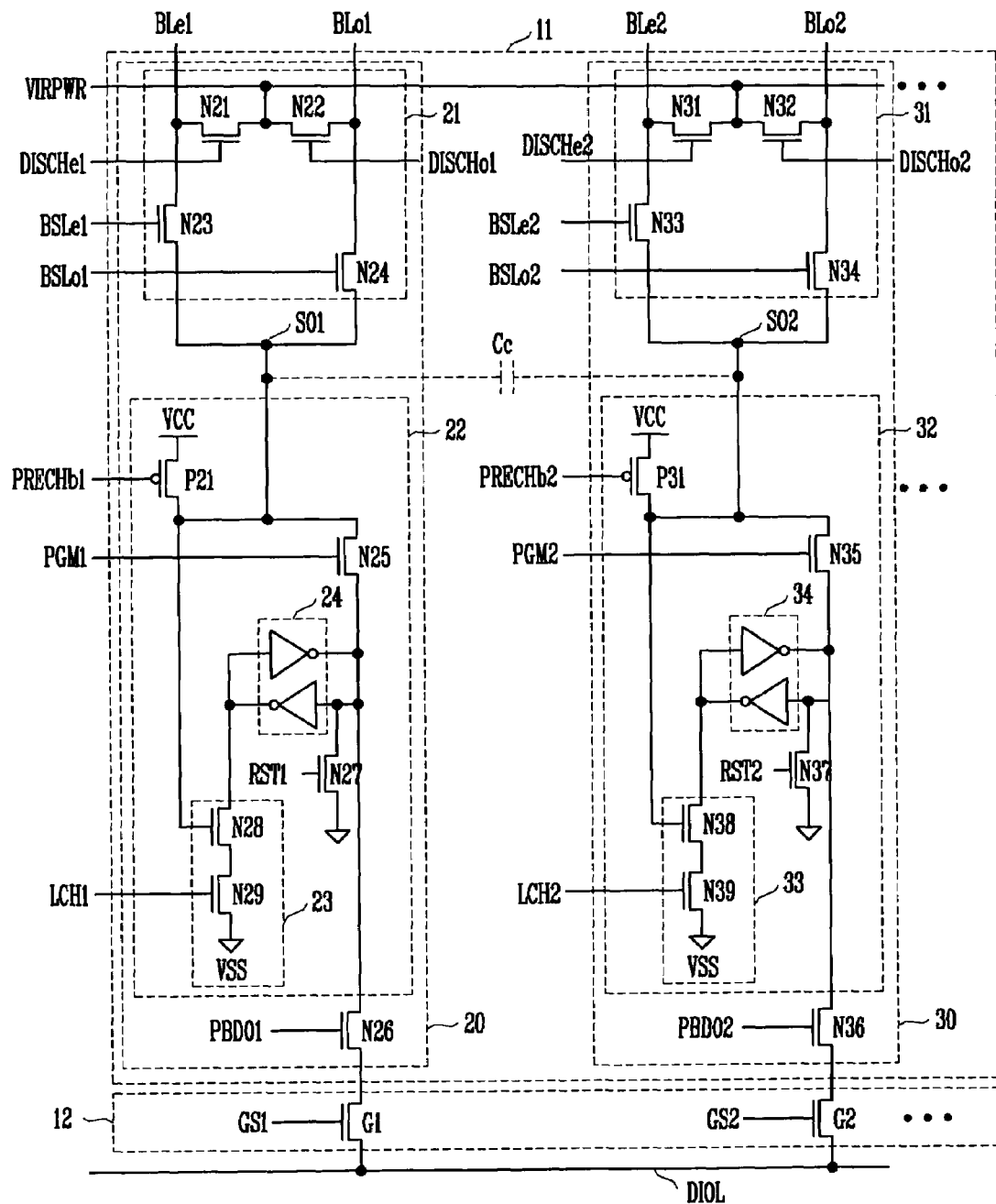
FIG. 1 is a circuit diagram showing a page buffer circuit and a Y-gate circuit of a conventional flash memory device.
Figure 2:
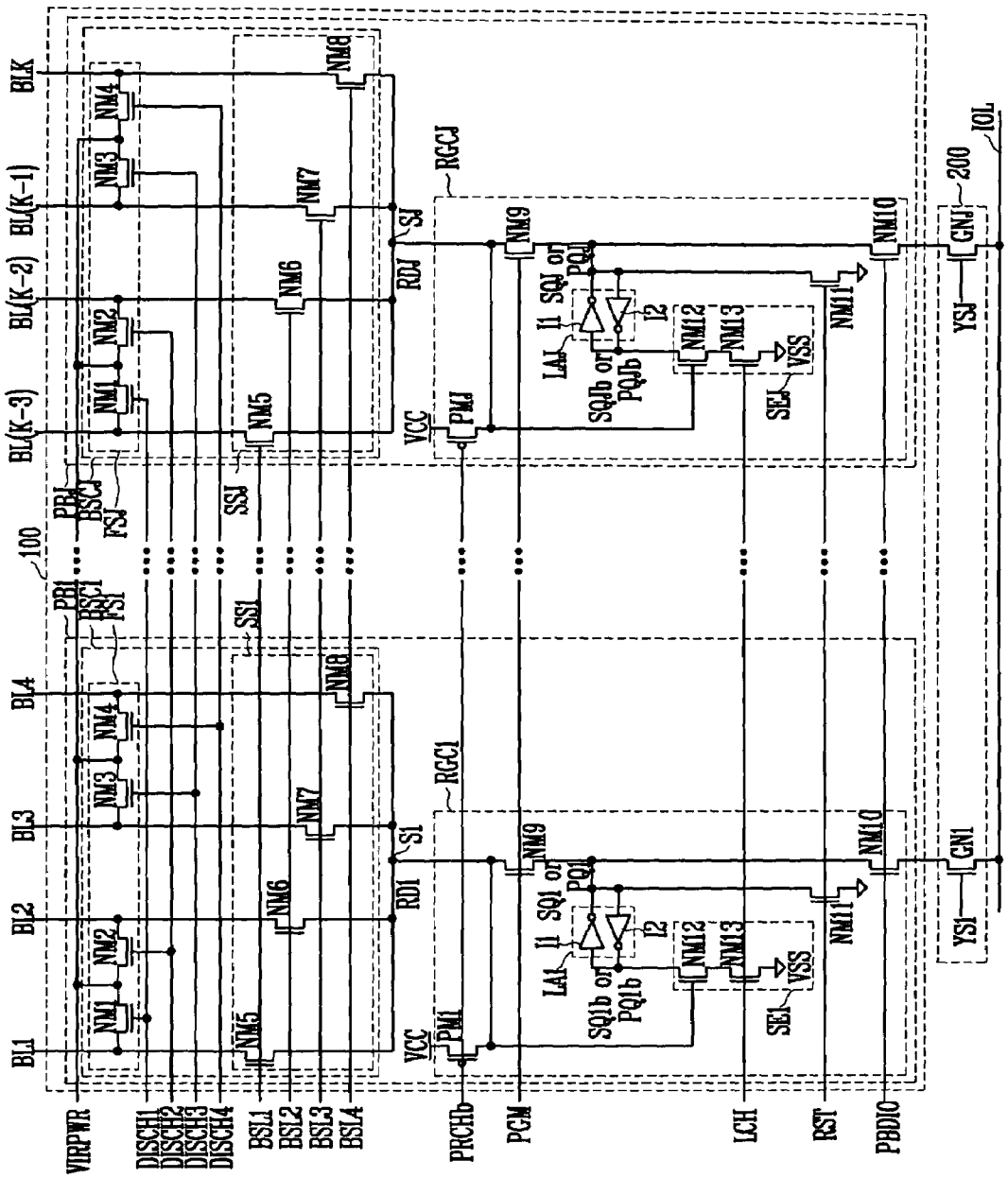
FIG. 2 is a circuit diagram showing a page buffer circuit and a Y-gate circuit of a flash memory device according to an embodiment of the present invention.

FIG. 2 is a circuit diagram showing a page buffer circuit and a Y-gate circuit of a flash memory device according to an embodiment of the present invention.

Referring to FIG. 2, a page buffer circuit 100 includes a group of page buffers PB1 to PBJ (where, J is a positive integer). Each of the group of page buffers PB1 to PBJ is connected to each of a predetermined number of bit lines, e.g., four bit lines and is also connected to each of Y-gates GN1 to GNJ (where, J is a positive integer) of a Y-gate circuit 200.

For example, the page buffer PB1 is connected to the bit lines BL1 to BL4. Furthermore, the group of page buffers PB1 to PBJ performs the read operation or the program operation at the same time in response to bit line control signals (DISCH1 to DISCH4) and bit line select signals (BSL1 to BSL4). The number of bit line control signals and the number of bit line select signals, which are input to the group of page buffers PB1 to PBJ, can be set to be the same as the number of bit lines, each connected to the group of page buffers PB1 to PBJ. In addition, the group of page buffers PB1 to PBJ are further provided with a precharge control signal (PRCHb), a program control signal (PGM), a latch control signal (LCH), a reset control signal (RST) and an I/O control signal (PBDIO).

The group of page buffers PB1 to PBJ includes bit line select circuits BSC1 to BSCJ and register circuits RGC1 to RGCJ, respectively. The construction and detailed operation of the group of page buffers PB1 to PBJ are the same. Therefore, the construction and operation of the page buffer PB1 will be described for simplicity. The page buffer PB1 includes a bit line select circuit BSC1 and a register circuit RGC1. The bit line select circuit BSC1 includes a first select circuit FS1 and a second select circuit SS1. The first select circuit FS1 includes first switches NM1 to NM4. The first switches NM1 to NM4 are connected between the bit lines BL1 to BL4 and a bit line bias voltage (VIRPWR). The first switches NM1 to NM4 are turned on or off in response to the bit line control signals DISCH1 to DISCH4, respectively. For example, the first switches NM1 to NM4 can be implemented using NMOS transistors and are turned on when the bit line control signals DISCH1 to DISCH4 are enabled. The first switches NM1 to NM4 supply a bit line bias voltage (VIRPWR) of a voltage level (e.g., VCC), which is set when being turned on, to the bit lines BL1 to BL4. When one of the bit line control signals DISCH1 to DISCH4 is disabled, the remaining bit line control signals DISCH1 to DISCH4 are enabled. Therefore, when one of the first switches NM1 to NM4 is turned off, the remaining first switches NM1 to NM4 are turned on.

The second select circuit SS1 includes second switches NM5 to NM8. The second switches NM5 to NM8 are connected between the bit lines BL1 to BL4 and the sensing node S1. The second switches NM5 to NM8 are turned on or off in response to the bit line select signals (BSL1 to BSL4), respectively. For example, the second switches NM5 to NM8 can be implemented using NMOS transistors. The second switches NM5 to NM8 are turned on when the bit line select signals (BSL1 to BSL4) are enabled. When the second switches NM5 to NM8 are turned on, the second switches NM5 to NM8 connect the bit lines BL1 to BL4 to the sensing node S1. When one of the bit line select signals (BSL1 to BSL4) is enabled, the remaining signals are disabled. Therefore, when one of the second switches NM5 to NM8 is turned on, the remaining switches are turned off.

The register circuit RGC1 includes a precharge circuit PM1, a sensing circuit SE1, a latch circuit LA1, a first pass circuit NM9, a second pass circuit NM10 and a latch reset circuit NM11. The precharge circuit PM1 precharges the sensing node S1 with the voltage (VCC) level in response to the precharge control signal (PRCHb). The sensing circuit SE1 senses read data (RD1) from one of the bit lines BL1 to BL4 connected to the sensing node S1 in response to the latch control signal (LCH) at the time of the read operation and generates sensing data (SQ1b). The latch circuit LA1 latches the sensing data (SQ1b) at the time of the read operation and latches program data (PQ1) at the time of the program operation.

The first pass circuit NM9 is connected between the latch circuit LA1 and the sensing node S1 and outputs the program data (PQ1), which are received from the latch circuit LA1, to the sensing node S1 in response to a program control signal (PGM) during the program operation. The first pass circuit can be implemented using a NMOS transistor and outputs the program data (PQ1) to the sensing node S1 when the program control signal (PGM) is enabled.

The second pass circuit NM10 is connected between the latch circuit LA1 and the Y-gate GN1. The second pass circuit NM10 outputs inverted data (SQ1) of the sensing data (SQ1b), which are received from the latch circuit LA1, to the Y-gate GN1 in response to an I/O control signal (PBDIO) in the read operation. Furthermore, the second pass circuit NM10 outputs the program data (PQ1), which are received from the Y-gate GN1, to the latch circuit LA1 in response to the I/O control signal (PBDIO) at the time of the program operation. For example, the second pass circuit can be implemented using a NMOS transistor. The second pass circuit outputs the inversed data (SQ1) to the Y-gate GN1 or the program data (PQ1) to the latch circuit LA1 when the I/O control signal (PBDIO) is enabled. The latch reset circuit NM11 initializes the latch circuit LA1 in response to the reset control signal (RST).

As described above, the page buffer circuit 100 includes page buffers, which are connected to every four bit lines one by one and can selectively gain access to one of memory cells connected to the four bit lines, respectively. Accordingly, the number of sensing nodes of the page buffer circuit 100 (i.e., coupling capacitance component) can be reduced by half compared to a conventional page buffer circuit in which one page buffer is connected every to bit lines. In addition, since the number of page buffers included in the page buffer circuit 100 can be also reduced by half, the overall chip size can be reduced.

Figure 3:
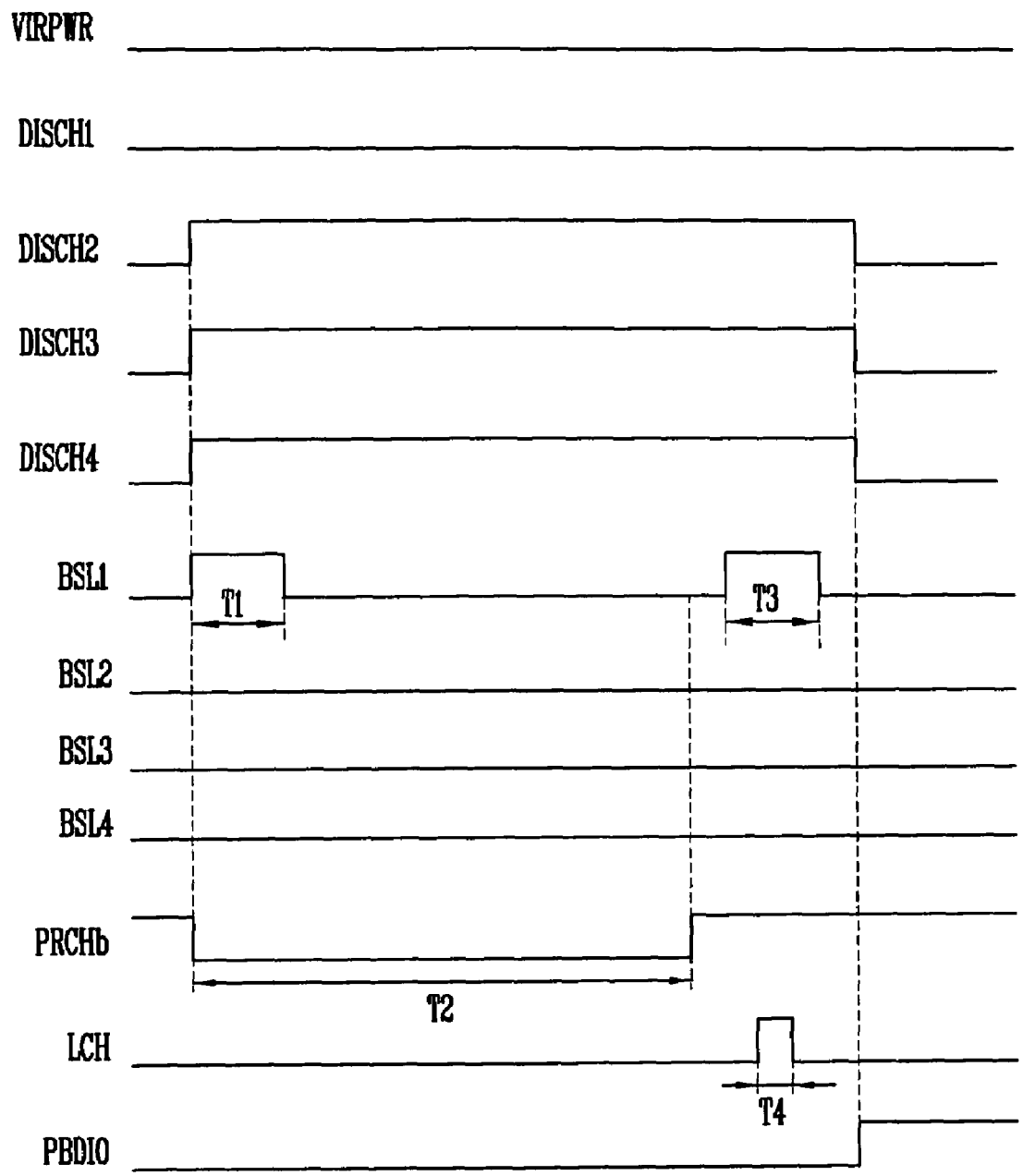
FIG. 3 is a timing diagram illustrating signals related to the read operation of the page buffer circuit shown in FIG. 2.

The read operation of the page buffer circuit 100 will now be described in more detail with reference to FIG. 3. FIG. 3 is a timing diagram illustrating signals related to the read operation of the page buffer circuit shown in FIG. 2. For example, a case where four bit lines are connected to each of the page buffers PB1 to PBJ and read data from a first bit line (i.e., BL1, BL5, BL9, . . . BL(K−3)) of the four bit lines are input to each of the page buffers PB1 to PBJ will be described.

Though not shown in FIG. 3, the reset control signal (RST) is initially enabled and then disabled during a setting time. As a result, the latch reset circuit NM11 of the page buffers PB1 to PBJ initializes the latch circuits LA1 to LAJ. The bit line control signal (DISCHI) remains disabled and the bit line control signals (DISCH2 to DISCH4) are all enabled. The first switch NM1 of each of the page buffers PB1 to PBJ is turned off in response to the bit line control signal (DISCHI). Furthermore, the first switches NM2 to NM4 of each of the page buffers PB1 to PBJ are turned on in response to the bit line control signals (DISCH2 to DISCH4), so that the bit line bias voltage (VIRPWR) is consecutively supplied to the bit lines BL2 to BL4, . . . , BL(K−2 to BLK). As a result, the bit lines BL2 to BL4, . . . , BL(K−2 to BLK) have the voltage (VCC) level by means of the bit line bias voltage (VIRPWR).

Thereafter, during a setting time T1, the bit line select signal (BSL1) is enabled and the bit line select signals (BSL2 to BSL4) remain disabled. Accordingly, the second switch NM5 of each of the page buffers PB1 to PBJ is turned on in response to the bit line select signal (BSL1) and connects the bit lines BL1, BL5, BL9, . . . BL(K−3) to the sensing nodes S1 to SJ, respectively. In addition, the second switches NM6 to NM8 are all turned off in response to the bit line select signals (BSL2 to BSL4), separating the bit lines BL2 to BL4, . . . , BL(K−2 to BLK) from the sensing nodes S1 to SJ.

Meanwhile, when the bit line select signal (BSL1) is enabled, the precharge control signal (PRCHb) is disabled during a setting time T2. For example, the setting time T2 can be set to be longer than the setting time T1. The precharge circuits PM1 to PMJ of each of the page buffers PB1 to PBJ precharges the sensing nodes S1 to SJ with the voltage (VCC) level in response to the precharge control signal (PRCHb). After the setting time T2, the bit line select signal (BSL1) is again enabled during a setting time T3. As a result, the second switch NM5 of each of the page buffers PB1 to PBJ is again turned on in response to the bit line select signal (BSL1) and connects the bit lines BL1, BL5, BL9, . . . BL(K−3) to the sensing nodes S1 to SJ, respectively. As a result, read data (RD1 to RDJ) from the bit lines BL1, BL5, BL9, . . . BL(K−3) are transferred to the sensing nodes S1 to SJ, respectively.

Furthermore, when the bit line select signal (BSL1) is enabled during the setting time T3, the latch control signal (LCH) is disabled during a setting time T4. The sensing circuits SE1 to SEJ of the page buffers PB1 to PBJ sense the read data (RD1 to RDJ) of the sensing nodes S1 to SJ in response to the latch control signal (LCH) and generate sensing data (SQ1b to SQJb), respectively. The latch circuits LA1 to LAJ of the page buffers PB1 to PBJ latch the sensing data (SQ1b to SQJb), respectively, and output the inversed data (SQ1 to SQJ), respectively. After the setting time T3 is elapsed, the I/O control signal (PBDIO) is enabled and the second pass circuits NM10 of the page buffers PB1 to PBJ output the inversed data (SQ1 to SQJ) to the Y-gates GN1 to GNJ, respectively, in response to the I/O control signal (PBDIO). Though not shown in FIG. 3, the gate control signals (YS1 to YSJ) are sequentially enabled one by one and the Y-gates GN1 to GNJ sequentially output the inversed data (SQ1 to SQJ) to a data I/O line IOL one by one.

Figure 4:
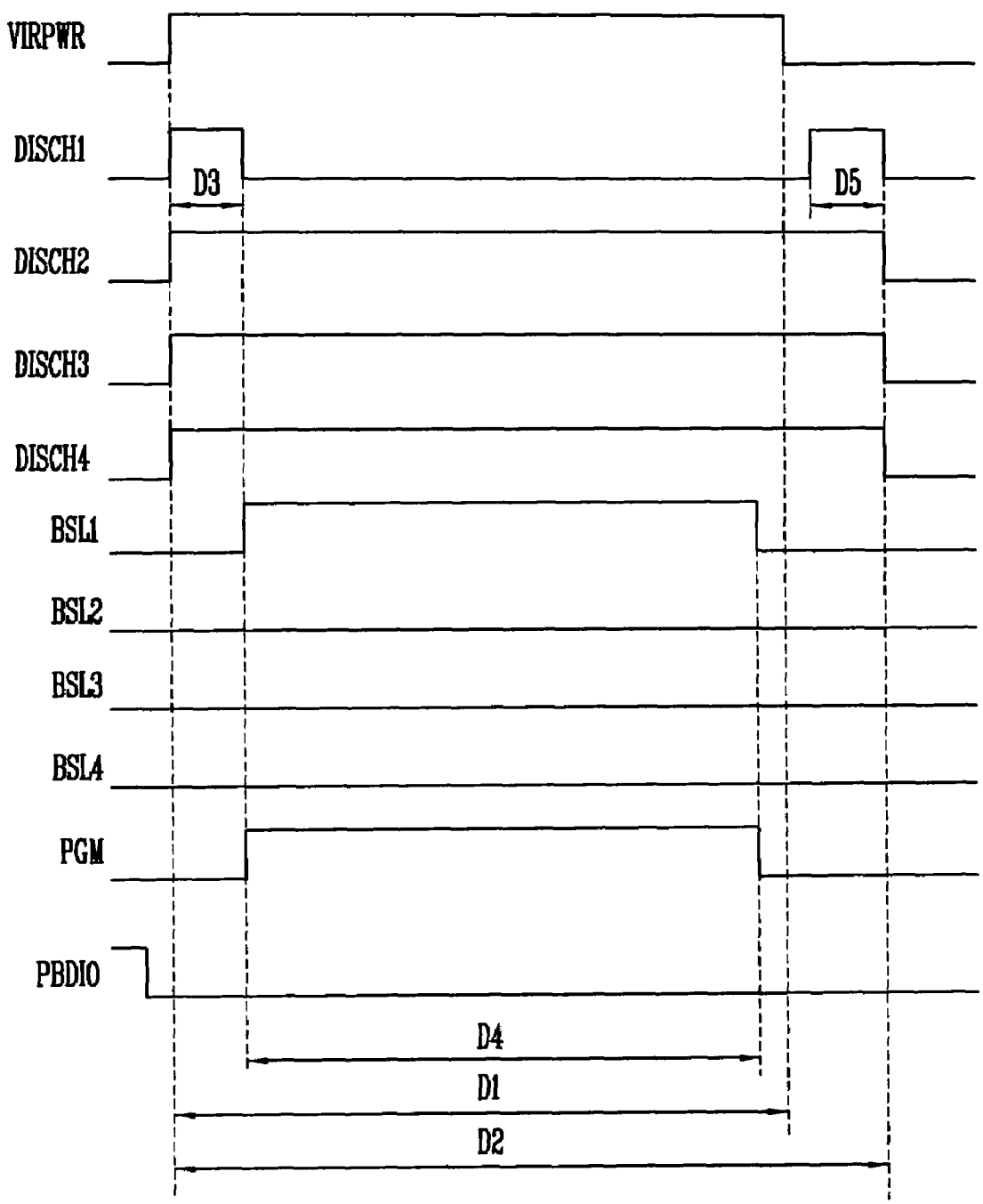
FIG. 4 is a timing diagram illustrating signals related to the program operation of the page buffer circuit shown in FIG. 2.

The program operation of the page buffer circuit 100 will be described in more detail with reference to FIG. 4. FIG. 4 is a timing diagram illustrating signals related to the program operation of the page buffer circuit shown in FIG. 2. For example, a case where four bit lines are connected to each of the page buffers PB1 to PBJ and the page buffers PB1 to PBJ output program data to the first bit line (i.e., BL1, BL5, BL9, . . . BL(K−3) of the four bit lines will be described.

Though not shown in FIG. 4, the I/O control signal (PBDIO) is initially enabled, and the gate control signals (YS1 to YSJ) are sequentially enabled one by one while the I/O control signal (PBDIO) is enabled. As a result, the Y-gates GN1 to GNJ output the program data (PQ1 to PQJ), which are consecutively received through the data I/O line IOL, to the second pass circuits NM10 of the page buffers PB1 to PBJ one by one. After the Y-gate GN1 outputs the program data (PQ1) to the second pass circuit NM10 of the page buffer PB1, the Y-gate GN2 outputs the program data (PQ2) to the second pass circuit of the page buffer circuit PB2. In a similar way, the Y-gates GN3 to GNJ are sequentially driven. Furthermore, the second pass circuits NM10 of the page buffers PB1 to PBJ are consecutively driven one by one in response to the I/O control signal (PBDIO) and output the program data (PQ1 to PQJ), which are sequentially received from the Y-gates GN1 to GNJ, to the latch circuits LA1 to LAJ, respectively. As a result, the latch circuits LA1 to LAJ latch the program data (PQ1 to PQJ), respectively. The I/O control signal (PBDIO) is then disabled.

Meanwhile, the bit line bias voltage (VIRPWR) becomes the voltage (VCC) level during a setting time D1 and becomes the ground voltage level after the setting time D1. The bit line control signals (DISCH2 to DISCH4) are all enabled during a setting time D2. Furthermore, when the bit line control signals (DISCH2 to DISCH4) are enabled, the bit line control signal (DISCH1) is enabled and then disabled during a setting time D3. In one embodiment of the present invention, the setting times D1 to D3 have the relation D2>D1>D3. As a result, after the first switch NM1 of each of the page buffers PB1 to PBJ is turned on during the setting time D3 in response to the bit line control signal (DISCH1), NM1 is then turned off, so that the bit line bias voltage (VIRPWR) is applied to the first bit lines BL1, BL5, BL9, . . . BL(K−3) during the setting time D3.

Furthermore, the first switches NM2 to NM4 of each of the page buffers PB1 to PBJ are turned on during the setting time D2 in response to the bit line control signals (DISCH2 to DISCH4) and consecutively supply the bit line bias voltage (VIRPWR) to the bit lines BL2 to BL4, . . . , BL(K−2 to BLK). As a result, the bit lines BL2 to BL4, . . . , BL(K−2 to BLK) are set to the voltage (VCC) level by the bit line bias voltage (VIRPWR) during the setting time D1 and have the ground voltage level after the setting time D1.

In addition, after the setting time D3, the bit line select signal (BSL01) is enabled during a setting time D4 and the bit line select signals (BSL2 to BSL4) remain disabled. In one embodiment of the present invention, the setting time D4 is shorter than the setting time D1. The second switch NM5 of each of the page buffers PB1 to PBJ is turned on in response to the bit line select signal (BSL1) and connects the bit lines BL1, BL5, BL9, . . . BL(K−3) to the sensing nodes S1 to SJ, respectively. Furthermore, the second switches NM6 to NM8 are all turned on in response to the bit line select signals (BSL2 to BSL4), separating the bit lines BL2 to BL4, . . . , BL(K−2 to BLK) from the sensing nodes S1 to SJ, respectively. In addition, when the bit line select signal (BSL1) is enabled, the program control signal (PGM) is enabled during the setting time D4. The first pass circuits NM9 of the page buffers PB1 to PBJ output the program data (PQ1 to PQJ), which are received from the latch circuits LA1 to LAJ, to the sensing nodes S1 to SJ, respectively, in response to the program control signal (PGM). As a result, the program data (PQ1 to PQJ) are respectively input to the bit lines BL1, BL5, BL9, . . . BL(K−3), each connected to the sensing nodes S1 to SJ.

Furthermore, after the setting time D1, the bit line control signal (DISCHI) is enabled during a setting time D5. Accordingly, the first switches NM1 of the page buffers PB1 to PBJ are turned on during the setting time D5 in response to the bit line control signal (DISCH1) and supply the bit line bias voltage (VIRPWR) to the first bit lines BL1, BL5, BL9, . . . BL(K−3). Since the bit line bias voltage (VIRPWR) is kept to the ground voltage level during the setting time D5, the first bit lines BL1, BL5, BL9, . . . BL(K−3) are discharged to the ground voltage.

As described above, according to the present invention, each of page buffers included in a page buffer circuit selectively gains access to one of memory cells connected to a predetermined number of bit lines, respectively. As a result, coupling capacitance component between sensing nodes can be reduced and the overall chip size can be reduced.

Although the foregoing description has been made with reference to the embodiments, it is to be understood that changes and modifications of the present invention may be made by those ordinary skilled in the art without departing from the spirit and scope of the present invention and appended claims.

What is claimed is:

1. A control method for a read operation of a page buffer circuit of a flash memory device, comprising:
    selecting a bit line from a predetermined number of bit lines that are coupled to a sense node using a bit line select circuit of a given page buffer coupled to the predetermined number of bit lines and coupled to a Y-gate to connect the selected bit line to a sensing node, wherein the predetermined number of bit lines is four, the given page buffer being one of a plurality of page buffers and the Y-gate being one of a plurality of Y-gates, a total number of page buffers not being equal to a total number of the bit lines;
    separating the remaining bit lines other than the selected bit line from the sensing node using the bit line select circuit to apply a bit line bias voltage to the remaining bit lines;
    sensing a voltage of the sensing node using a sensing circuit of each of the plurality of page buffers to generate sensing data, the voltage corresponding to read data from the selected bit line;
    latching and inversing the sensing data using a latch circuit of each of the plurality of page buffers and outputting the latched inversed data; and
    outputting the latched inversed data to one of the Y-gates in response to an I/O control signal using a switch of each of the plurality of page buffers, wherein each of the predetermined bit lines is coupled to one of the plurality of page buffers through the corresponding switch.

2. The control method as claimed in claim 1, further comprising:
    allowing a precharge circuit of each of the plurality of page buffers to precharge the sensing node with a predetermined voltage level in response to a precharge control signal, and applying bit line control signals and bit line select signals to the plurality of page buffers connecting the selected bit line to the sensing node,
    wherein the selected bit line is connected to the sensing node by the bit line select circuit in response to one of the bit line select signals that is enabled,
    wherein the bit line bias voltage is applied to the remaining bit lines by the bit line select circuit in response to the remaining bit line control signals.

3. A control method for a program operation of a page buffer circuit of a flash memory device, comprising the steps of:
    receiving and outputting program data from one of a plurality of Y-gates in response to an I/O control signal using a first switch of each of a plurality of page buffers, wherein each page buffer is coupled to a predetermined number of bit lines and is coupled to one of the Y-gates, wherein the predetermined number of bit lines is four, a total number of the plurality of page buffers not being equal to a total number of the bit lines;
    latching the program data received from the first switch using a latch circuit of each of the plurality of page buffers;
    selecting one of the predetermined number of bit lines coupled to a sensing node and coupling the selected bit line to the sensing node using a bit line select circuit of each of the plurality of page buffers, wherein each of the predetermined number of bit lines is coupled to one of the plurality of page buffers through the corresponding first switch;
    decoupling the remaining bit lines other than the selected bit line from the sensing node using the bit line select circuit to apply a bit line bias voltage to the remaining bit lines; and
    outputting the program data that are latched in the latch circuit to the selected bit line through the sensing node in response to a program control signal using a second switch of each of the plurality of page buffers.

4. The control method as claimed in claim 3, further comprising the steps of applying bit line control signals and bit line select signals to the plurality of page buffers,
    wherein in the step of connecting the selected bit line to the sensing node using the bit line select circuit, the bit line select circuit connects one of the predetermined number of bit lines to the sensing node in response to one of the bit line select signals that is enabled, and
    in the step of applying the bit line bias voltage to the remaining bit lines using the bit line select circuit, when one of the bit line control signals is enabled and the remaining bit line control signals are disabled, the bit line select circuit applies the bit line bias voltage to the remaining bit lines in response to the remaining bit line control signals.

5. A flash memory device, comprising:
    a plurality of bit line groups, wherein each bit line group comprises a first bit line, a second bit line, a third bit line, a fourth bit line and a sensing node;
    a first select circuit coupled to each bit line group, wherein each first select circuit comprises a first switch to provide a bit line bias voltage to the first bit line, a second switch to provide the bit line bias voltage to the second bit line, a third switch to provide the bit line bias voltage to the third bit line, and a fourth switch to provide the bit line bias voltage to the fourth bit line;
    a second select circuit coupled to each bit line group, wherein each second select circuit comprises a fifth switch coupled between the sensing node and the first bit line, a sixth switch coupled between the sensing node and the second bit line, a seventh switch coupled between the sensing node and the third bit line, and a eighth switch coupled between the sensing node and the fourth bit line; and a register circuit coupled to each bit line group such that each register circuit is coupled to the first bit line, the second bit line, the third bit line and the fourth bit line of one bit line group, wherein the number of register circuits is not equal to a total number of the bit lines, each register circuit being coupled between the sensing node of the one bit line group and a Y-gate.

6. The flash memory device as claimed in claim 5, wherein one of the switches of the first select circuit is deactivated and the remaining switches of the first select circuit are activated during a read operation.

7. The flash memory device as claimed in claim 5, wherein one of the switches of the first select circuit is deactivated during a first predetermined time and the remaining switches of the first select circuit are activated during a second predetermined time during a program operation, the second predetermined time being longer than the first predetermined time.

8. The flash memory device as claimed in claim 5, wherein the register circuit comprises:

a precharge circuit configured to precharge the sensing node with a predetermined voltage level in response to a precharge control signal;

a sensing circuit configured to sense a read data and generate a sensing data in response to a latch control signal during a read operation;

a latch circuit configured to latch the sensing data during the read operation and latch a program data during a program operation;

a first pass circuit coupled between the latch circuit and the sensing node, the first pass circuit configured to output the program data that are received from the latch circuit to the sensing node in response to a program control signal during the program operation;

a second pass circuit coupled between the latch circuit and one of the Y-gate, the second pass circuit configured to output inverted data of the sensing data that are received from the latch circuit to the Y-gate in response to an I/O control signal during the read operation, and output the program data to the latch circuit in response to the I/O control signal during the program operation; and a latch reset circuit configured to initialize the latch circuit in response to a reset control signal.

\* \* \* \* \*